(12) United States Patent
Samavati

(10) Patent No.: US 7,567,142 B2
(45) Date of Patent: Jul. 28, 2009

(54) QUASI-BALUN

(75) Inventor: Hirad Samavati, Santa Clara, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 267 days.

(21) Appl. No.: 11/424,972

(22) Filed: Jun. 19, 2006

(65) Prior Publication Data

US 2006/0290441 A1 Dec. 28, 2006

Related U.S. Application Data

(60) Provisional application No. 60/693,588, filed on Jun. 24, 2005.

(51) Int. Cl.
*H01P 5/10* (2006.01)
*H03H 11/32* (2006.01)

(52) U.S. Cl. .............................. 333/25; 333/4

(58) Field of Classification Search .................. 333/25, 333/26; 330/306, 302
See application file for complete search history.

(56) References Cited

U.S. PATENT DOCUMENTS 6,714,099 B2 * 3/2004 Hikita et al. ................. 333/133

\* cited by examiner

*Primary Examiner*—Dean O Takaoka
(74) *Attorney, Agent, or Firm*—Bever, Hoffman & Harms, LLP; Jeanette S. Harms

(57) ABSTRACT

A quasi-balun circuit for receiving an unbalanced input and providing signals to a balanced-input low noise amplifier (LNA) is provided. Notably, this quasi-balun circuit can provide a phase difference between the positive and the negative terminals of the LNA that is greater than 90 degrees, but less than 180 degrees. In one embodiment, the quasi-balun circuit can provide a phase difference of approximately 135 degrees. To provide this functionality, the quasi-balun circuit includes a passive, reactive network coupled between the unbalanced input and the LNA.

2 Claims, 4 Drawing Sheets

QUASI-BALUN

RELATED APPLICATIONS

This application claims priority of U.S. Provisional Patent Application 60/693,588, entitled "Quasi-Balun" filed Jun. 24, 2005.

BACKGROUND OF THE INVENTION

1. Field of the Invention

The present invention relates to unbalanced (i.e. single-ended signal) to balanced signal (i.e. differential signal) conversion. More particularly, the invention relates to a matching network converting from an unbalanced signal input to a component having a balanced input.

2. Background of the Related Art

A "balun" is a circuit element or a collection of circuit elements that transforms an unbalanced signal into a balanced signal. The balanced signal has two components, wherein a first and second component are related to the unbalanced signal but are mutually substantially opposite in phase (i.e. a 180° phase shift).

An exemplary use of a balun may be found in a radio receiver, which usually includes a low noise amplifier (LNA) for receiving signals from an antenna. An LNA is frequently implemented in a balanced-input (i.e. differential) configuration, especially when implemented on an integrated circuit. An antenna is commonly a source of unbalanced signals, thereby requiring conversion to feed an LNA.

Transformers are useful for this conversion, wherein an unbalanced input can be connected to one side of a first winding and the other side of the first winding can be connected to ground. For example, FIG. 1A illustrates a balun circuit 100 having an unbalanced input 110 connected to a first winding of a transformer 111 (which is further connected to ground). A second winding of transformer 111 then presents two signals to a balanced-input LNA 118. Therefore, transformer 111 serves as a balun for balanced-input LNA 118. In this embodiment, capacitors 115 and 116 are DC-blocking coupling capacitors of relatively large value (e.g. 39 pF) that connect the second winding of transformer 111 to the positive and negative terminals of LNA 118. Unfortunately, transformers are relatively expensive components, especially transformers suitable for use at higher radio frequencies (e.g. 1.9 GHz). Therefore, as microelectronics decrease in cost, the cost of transformer 111 becomes commercially non-viable for a manufacturer.

Note that it is possible to simply feed the antenna input to one side of a balanced-input LNA. For example, FIG. 1B illustrates a balun circuit 120 having unbalanced input 110 connected through a coupling capacitor 123 and a matching network 124 (including a matching capacitor 125 and inductor 126) to the negative input terminal of LNA 118. The positive input terminal of LNA 118 is terminated through a coupling capacitor 122 and a resistor 121 to ground.

Although balun circuit 120 is less expensive than balun circuit 100 (FIG. 1A), resistor 121 can generate undesirable thermal noise. Moreover, the difference in circuit structure on each of the input terminals in balun circuit 120 raises the LNA's susceptibility to common mode noise. Therefore, balun circuit 120 can fail to provide robust common-mode signal rejection, which is a noise mitigating property of balanced circuits.

Thus, a typical implementation of balun circuit 120 generates a higher noise figure (NF) than balun circuit 100 (FIG. 1A). For example, in one typical implementation of balun circuit 120 operating at 1.9 GHz (e.g. capacitors 122, 123, 125 having capacitances of 39 pF, 39 pF, and 1.5 pF, respectively, resistor 121 having a resistance of 50 Ohms, and inductor 126 having an inductance of 4.7 nH), a noise figure (NF) of approximately 4 dB was measured from unbalanced input 110 to the output of LNA 118 compared to the above-described implementation of balun circuit 100 that generated only 3 dB.

Therefore, a need arises for a method and an apparatus that can provide a low-cost, low-noise unbalanced to balanced conversion for an LNA.

SUMMARY OF THE INVENTION

A quasi-balun circuit for receiving an unbalanced input and providing signals to a balanced-input low noise amplifier (LNA) is provided. Notably, this quasi-balun circuit can generate positive and negative output signals with substantially the same magnitude, but having a phase difference that is less than 180 degrees. In one embodiment, the quasi-balun circuit can provide a phase difference of approximately 135 degrees.

To provide this functionality, the quasi-balun circuit includes a passive, reactive network coupled between the unbalanced input and the LNA. In one embodiment, the quasi-balun circuit can include a capacitor and an inductor. The capacitor is connected between a node and the unbalanced input, whereas the inductor is connected between the positive input terminal of the LNA and the node. The node is connected to the negative input terminal of the LNA.

In another embodiment, the passive, reactive network includes a capacitor connected between a node and an RF ground as well as an inductor connected between the positive input terminal of the LNA and the node. Once again, the node is connected to the negative input terminal of the LNA. In this embodiment, the quasi-balun circuit further includes a coupling capacitor connected between node and the unbalanced input.

Notably, both configurations of the quasi-balun circuit can advantageously provide a low noise figure (NF) of approximately 3 dB from the unbalanced input to the output of the LNA. Moreover, both configurations of the quasi-balun circuit use inexpensive components (compared to a transformer balun implementation) and minimize susceptibility to common mode noise (compared to a single-ended balun implementation).

DETAILED DESCRIPTION OF THE FIGURES

By definition, a balun generates a 180 degree phase difference between its outputs, which are provided to the positive and negative input terminals of the balanced-input low noise amplifier (LNA). Moreover, these balun outputs have the same magnitude. Unfortunately, current implementations of balun circuits have undesirable size, cost, or noise limitations.

In accordance with one aspect of the invention, a substantially similar magnitude for positive and negative outputs (at a frequency of 1.9 GHz) can be provided, but with a phase difference less than 180 degrees. Because the phase difference is less than 180 degrees, the circuit providing this phase difference is called a "quasi-balun" circuit herein. This quasi-balun circuit advantageously compromises between magnitude accuracy and phase accuracy while ensuring inexpensive implementation and providing a low noise figure (NF).

Figure 2A:
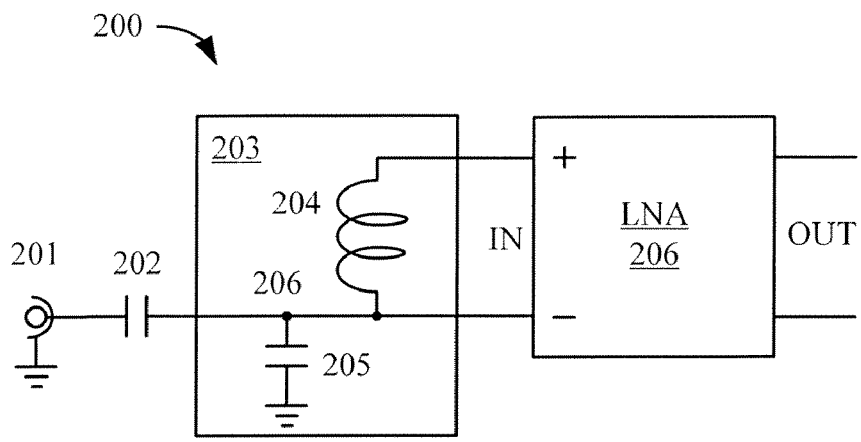
FIG. 2A illustrates a quasi-balun circuit including a passive, reactive network in a parallel configuration disposed between both input terminals of a balanced-input LNA.

FIG. 2A illustrates a quasi-balun circuit 200 that couples an unbalanced input 201 to both input terminals of a balanced-input LNA 206. In this embodiment, quasi-balun circuit 200 includes a coupling capacitor 202 and a passive, reactive network 203. (Note that a passive, reactive network includes passive, reactive components (e.g. capacitors and inductors) in contrast to the resistive and transformer components included in known balun circuits.) Passive, reactive network 203 includes a node 206 that is connected between coupling capacitor 202 and a negative input terminal of LNA 206. Passive, reactive network 203 further includes an inductor 204 connected between the positive input terminal of LNA 206 and node 206 and a capacitor 205 connected between ground and node 206. In one embodiment, the values of coupling capacitor 202, capacitor 205, and inductor 204 are, respectively, 39 pF, 1.5 pF, and 4.7 nH.

Figure 3A:
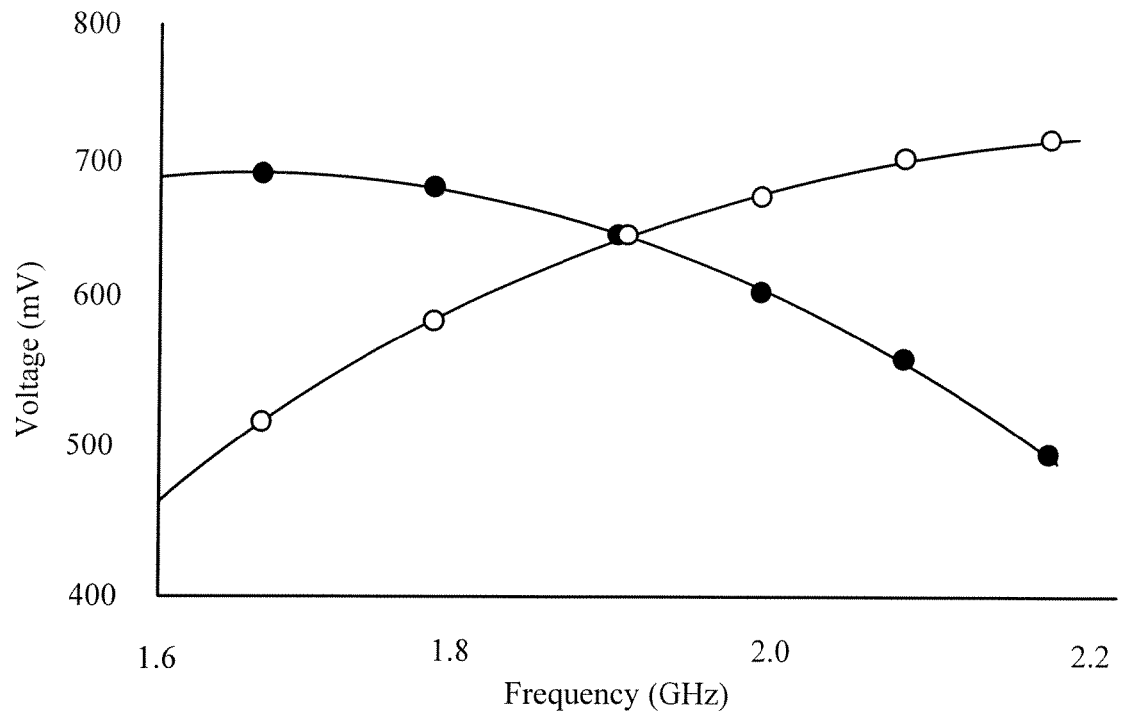
FIG. 3A illustrates a graph for a quasi-balun circuit that plots the magnitudes of the positive output signal (white circles) and the negative output signal (black circles) as a function of input frequency.

Notably, using these values, quasi-balun circuit 200 can provide a phase difference between the positive and negative input terminals of LNA 206 of approximately 135 degrees when receiving a signal at 1.9 GHz. Although this phase difference is less than the 180 degree phase difference provided by a balun, 135 degrees actually provides substantially the same signal magnitude for the positive and negative outputs. For example, using the above-described implementation of quasi-balun circuit 200, FIG. 3A illustrates a graph that plots the magnitudes (in mV) of the positive output signal (white circles) and the negative output signal (black circles) as a function of frequency (GHz). As shown in FIG. 3A, the magnitudes are substantially the same at 1.9 GHz.

Figure 3B:
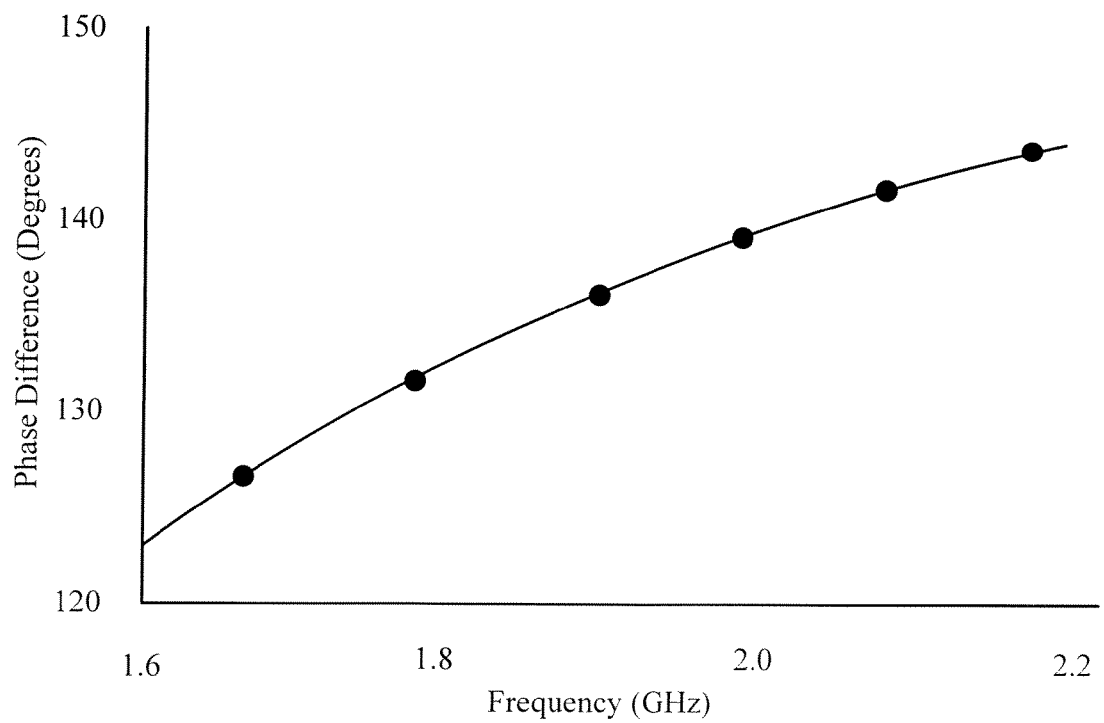
FIG. 3B illustrates a graph for a quasi-balun circuit that plots phase difference (in degrees) versus input frequency (GHz).

Note that this phase difference may vary with changes in the input frequency, thus requiring component selection suitable to a given operating frequency. For example, FIG. 3B illustrates a corresponding graph of phase difference (in degrees) versus input frequency (GHz). With regards to component selection, components are selected such that at the frequency of interest, the amplitude of the positive and negative signals are substantially the same and the phase difference between these signals is maximized (i.e. phase difference is as close to 180 degrees as possible given the input impedance of the LNA and the selected topology of the quasi-balun circuit).

Quasi-balun circuit 200 advantageously provides a low noise figure (NF). For example, using the above values for coupling capacitor 202 and passive, reactive network 203, quasi-balun 200 can provide a minimal NF of approximately 3 dB from unbalanced input 201 to the output of LNA 206.

Figure 2B:
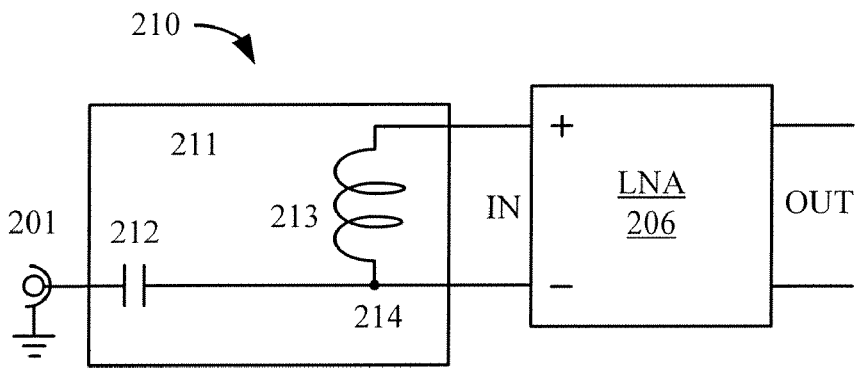
FIG. 2B illustrates a quasi-balun circuit including a passive, reactive network in a series configuration disposed between both inputs of a balanced-input LNA.

FIG. 2B illustrates another quasi-balun circuit 210 that couples unbalanced input 201 to both input terminals of balanced-input low noise amplifier (LNA) 206. In this embodiment, quasi-balun circuit 210 includes a passive, reactive network 211 in a series configuration. Specifically, passive, reactive network 211 includes a capacitor 212 connected between unbalanced input 201 and a node 214, which in turn is connected to the negative input terminal of LNA 206. Passive, reactive network 203 further includes an inductor 204 connected between the positive input terminal of LNA 206 and node 206. In one embodiment, the values of capacitor 212 and inductor 213 are, respectively, 2.2 pF, and 5.6 nH.

In this configuration, the phase difference between the positive and negative input terminals of LNA 206 is approximately 135 degrees when receiving a signal at 1.9 GHz. Again, this phase difference may vary with changes in the input frequency, thus requiring component selection suitable to a given operating frequency.

Quasi-balun circuit 210 also advantageously provides a low noise NF. For example, using the above values for passive, reactive network 211, quasi-balun circuit 210 can provide a minimal NF of approximately 3 dB from unbalanced input 201 to the output of LNA 206.

Figure 1A:
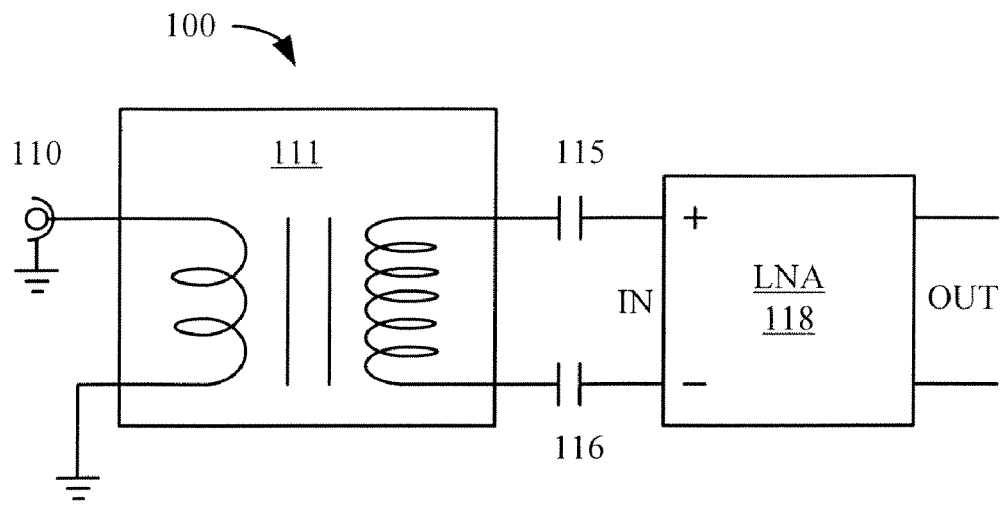
FIG. 1A illustrates a known balun circuit having transformer-based conversion from an unbalanced input to both inputs of a balanced-input low-noise amplifier (LNA).
Figure 1B:
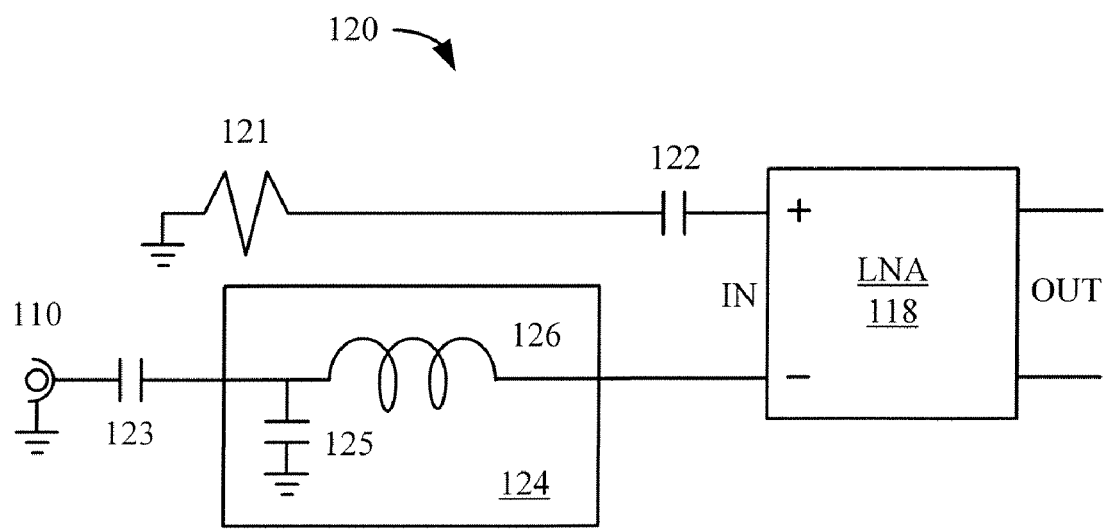
FIG. 1B illustrates a known balun circuit having a matching circuit connected to one input terminal of an LNA and a termination connected to the other input terminal of the balanced-input LNA.

Advantageously, the component count and thus cost of the quasi-balun circuits 200 and 210 are significantly less than those of the previously used balun circuits (e.g. balun circuit 100 of FIG. 1A and balun circuit 120 of FIG. 1B). Moreover, quasi-balun circuit 210 eliminates the need for a relatively large coupling capacitor as well, thereby further lowering costs.

Figure 4:
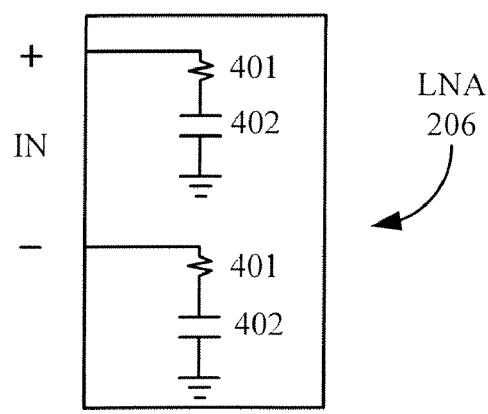
FIG. 4 illustrates a component equivalent model of the load presented by the LNA circuitry as seen at the input terminals of the LNA.

FIG. 4 illustrates a component equivalent model of the load presented by LNA 206 as seen by the passive, reactive network. Note that this load (wherein any non-ideal LNA would have such a load) can be affect the resonant frequency of the passive, reactive network and therefore this load is preferably considered when sizing the components of that network. Specifically, at each of the positive and negative input terminals of LNA 206, the passive, reactive network sees a load functionally equivalent to a resistor 401 and a capacitor 402 connected in series to ground. In one embodiment, the values of resistor 401 and capacitor 402 are, respectively, 27 Ohms and 2.7 pF.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, although the embodiments herein describe connections to the positive and negative input terminals of the low noise amplifier (LNA), other embodiments could switch these terminals and maintain the described functionality and advantages. Therefore, a "first" input terminal could refer to either the positive or the negative input terminal of the LNA. Logically, a "second" input terminal would then refer to the other input terminal of the LNA.

Figure 5:
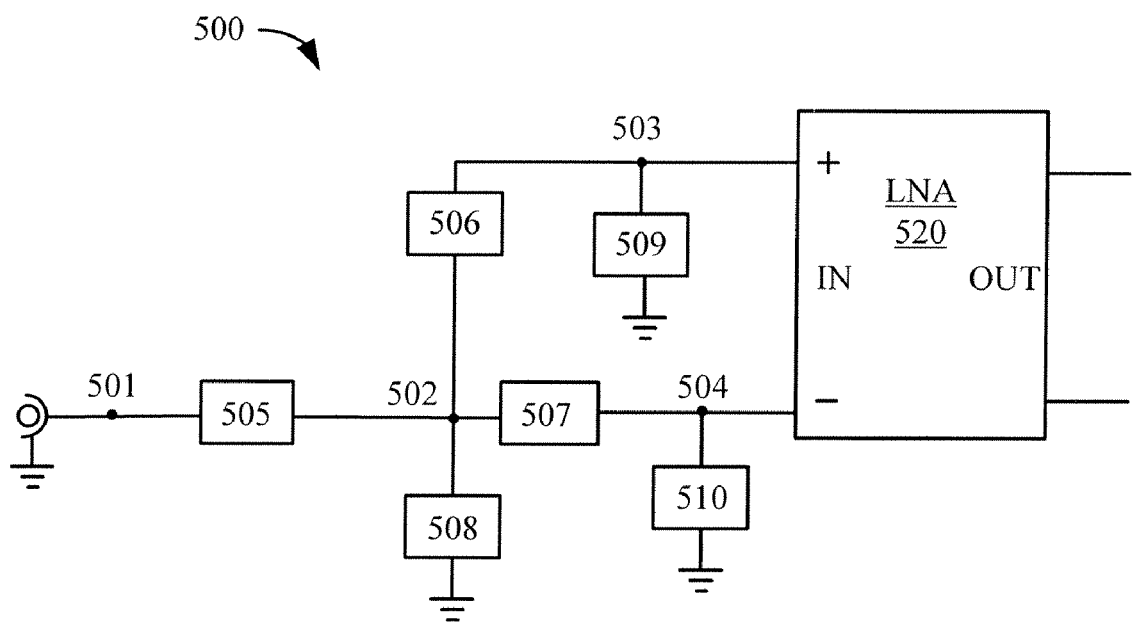
FIG. 5 illustrates a generic quasi-balun circuit.

Further note that although specific components are discussed in the above embodiments, other components can provide the appropriate functionality. For example, in a generic embodiment shown in FIG. 5, a quasi-balun 500 can include nodes 501-504, wherein input node 501 is connected to the input signal, node 502 is an intermediate node, output node 503 is connectable to one input terminal of LNA 520, and output node 504 is connectable to the other input terminal of LNA 520. A component 505, which is connected between input node 501 and intermediate node 502, can be implemented with an inductor, a capacitor or a short (i.e. a wire). A component 506, which is connected between intermediate node 502 and output node 503, can be implemented with an inductor, a capacitor, or a short. A component 507, which is connected between intermediate node 502 and output node 504, can be implemented with an inductor, a capacitor, or a short. A component 509, which if present is connected between output node 503 and ground, can be implemented with an inductor or a capacitor. A component 510, which if present is connected between output node 503 and ground, can be implemented with an inductor or a capacitor. A component 508, which if present is connected between intermediate node 502 and ground, can be implemented with an inductor or a capacitor. Note that for appropriate functioning as a quasi-balun circuit, one of components 506 and 507 is an inductor. Components 508, 509, and 510 are optionally present.

Accordingly, it is intended that the scope of the invention be defined by the following Claims and their equivalents.

The invention claimed is:

1. A quasi-balun circuit for receiving an unbalanced input and providing signals to a balanced-input low noise amplifier (LNA), the quasi-balun circuit consisting of:
   a capacitor connected between a node and the unbalanced input; and
   an inductor having a first terminal connected to a first input terminal of the LNA and a second terminal connected to the node,
   wherein the node is connected to a second input terminal of the LNA,
   wherein the quasi-balun circuit provides a phase difference between a first input terminal of the LNA and a second terminal of the LNA that is less than 180 degrees.

2. A quasi-balun circuit for receiving an unbalanced input and providing signals to a balanced-input low noise amplifier (LNA), the quasi-balun circuit consisting of:
   a first capacitor connected between a node and the unbalanced input;
   and
   an inductor having a first terminal connected to the first input terminal of the LNA and a second terminal connected to the node,
   wherein the node is connected to the second input terminal of the LNA.

* * * * *